US012160963B2

(12) United States Patent
Pyo et al.

(10) Patent No.: US 12,160,963 B2
(45) Date of Patent: Dec. 3, 2024

(54) DISPLAY DEVICE

(71) Applicant: LG ELECTRONICS INC., Seoul (KR)

(72) Inventors: Jonggil Pyo, Seoul (KR); Kwaneun Jin, Seoul (KR); Jaeyong Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 231 days.

(21) Appl. No.: 17/758,007

(22) PCT Filed: Dec. 27, 2019

(86) PCT No.: PCT/KR2019/018631
§ 371 (c)(1),
(2) Date: Jun. 24, 2022

(87) PCT Pub. No.: WO2021/132776
PCT Pub. Date: Jul. 1, 2021

(65) Prior Publication Data
US 2023/0337378 A1 Oct. 19, 2023

(51) Int. Cl.
*H05K 5/00* (2006.01)
*H05K 5/02* (2006.01)
(Continued)

(52) U.S. Cl.
CPC .......... *H05K 5/0217* (2013.01); *H10K 77/111* (2023.02); *H10K 2102/311* (2023.02)

(58) Field of Classification Search
USPC ........................................ 361/807, 809–810
See application file for complete search history.

(56) References Cited

U.S. PATENT DOCUMENTS

| 2011/0101294 A1* | 5/2011 | Yaoi | ........................ F16G 13/20 |
| | | | 254/385 |
| 2012/0167542 A1* | 7/2012 | Oitaka | .................... F16G 13/20 |
| | | | 59/85 |

(Continued)

FOREIGN PATENT DOCUMENTS

| JP | 4086971 | 5/2008 |
| KR | 100617632 | 9/2006 |

(Continued)

OTHER PUBLICATIONS

PCT International Application No. PCT/KR2019/018631, International Search Report dated Sep. 17, 2020, 2 pages.

*Primary Examiner* — Hung S. Bui
(74) *Attorney, Agent, or Firm* — LEE, HONG, DEGERMAN, KANG & WAIMEY

(57) ABSTRACT

Disclosed is a display device. The display device of the present disclosure includes: a housing that extends long and provides an internal accommodation space; a roller configured to be installed inside the housing; a display panel configured to be wound on or unwound from the roller; a module cover which extends long in a length direction of the housing, and includes a plurality of segments sequentially arranged in an up-down direction at a rearward direction of the display panel so as to be wound on or unwound from the roller together with the display panel; and a chain driving unit that is installed inside the housing, and unfolds the display panel and the module cover while a chain spreads from the inside of the housing to the outside.

8 Claims, 25 Drawing Sheets

(51) Int. Cl.
*H10K 77/10* (2023.01)
*H10K 102/00* (2023.01)

(56) References Cited

U.S. PATENT DOCUMENTS

| | | | | |
|---|---|---|---|---|
| 2013/0276422 A1* | 10/2013 | Saji | ......................... | F16G 13/20 |
| | | | | 59/93 |
| 2019/0138058 A1 | 5/2019 | Kwon et al. | | |
| 2021/0045258 A1* | 2/2021 | Lee | ...................... | H05K 5/0017 |
| 2021/0127512 A1* | 4/2021 | Lee | ...................... | H05K 5/0017 |
| 2022/0015249 A1* | 1/2022 | Kim | .................... | H05K 5/0217 |

FOREIGN PATENT DOCUMENTS

| | | | | | |
|---|---|---|---|---|---|
| KR | 20170006013 | * | 1/2017 | ............ | H01L 51/56 |
| KR | 1020170006012 | | 1/2017 | | |
| KR | 101787603 | | 10/2017 | | |

* cited by examiner

DISPLAY DEVICE

CROSS-REFERENCE TO RELATED APPLICATION(S)

This application is the National Stage filing under 35 U.S.C. 371 of International Application No. PCT/KR2019/018631, filed on Dec. 27, 2019, the contents of which are all incorporated by reference herein in its entirety.

TECHNICAL FIELD

The present disclosure relates to a display device.

BACKGROUND ART

As the information society develops, the demand for display devices is also increasing in various forms. In response to this, various display devices such as Liquid Crystal Display Device (LCD), Plasma Display Panel (PDP), Electroluminescent Display (ELD), and Vacuum Fluorescent Display (VFD) have been researched and used in recent years.

Among them, a display device using an organic light emitting diode (OLED) has superior luminance characteristics and viewing angle characteristics compared to a liquid crystal display device, and can be implemented in an ultra-thin shape as it does not require a backlight unit.

In addition, a flexible display panel can be bent or wound on a roller. By using the flexible display panel, it is possible to implement a display device that is roll out from a roller or wound on a roller. A lot of research has been done on a structure for winding or unwinding a flexible display panel on/from a roller.

DISCLOSURE

Technical Problem

An object of the present disclosure is to solve the above and other problems.

An object of the present disclosure may be to provide a structure in which a flexible display panel is wound on and roll out from a roller.

Technical Solution

In an aspect, there is provided a display device, including: a housing that extends long and provides an internal accommodation space; a roller configured to be installed inside the housing; a display panel configured to be wound on or unwound from the roller; a module cover which extends long in a length direction of the housing, and includes a plurality of segments sequentially arranged in an up-down direction at a rearward direction of the display panel so as to be wound on or unwound from the roller together with the display panel; and a chain driving unit that is installed inside the housing, and unfolds the display panel and the module cover while a chain spreads from the inside of the housing to the outside.

Advantageous Effects

The effect of the display device according to the present disclosure will be described as follows.

According to at least one of embodiments of the present disclosure, a structure in which the flexible display panel is wound on and roll out from a roller may be provided.

Further scope of applicability of the present disclosure will become apparent from the following detailed description. However, it should be understood that the detailed description and specific embodiments such as preferred embodiments of the present disclosure are given by way of example only, since various changes and modifications within the spirit and scope of the present disclosure may be clearly understood by those skilled in the art.

MODE FOR INVENTION

Figure 1:
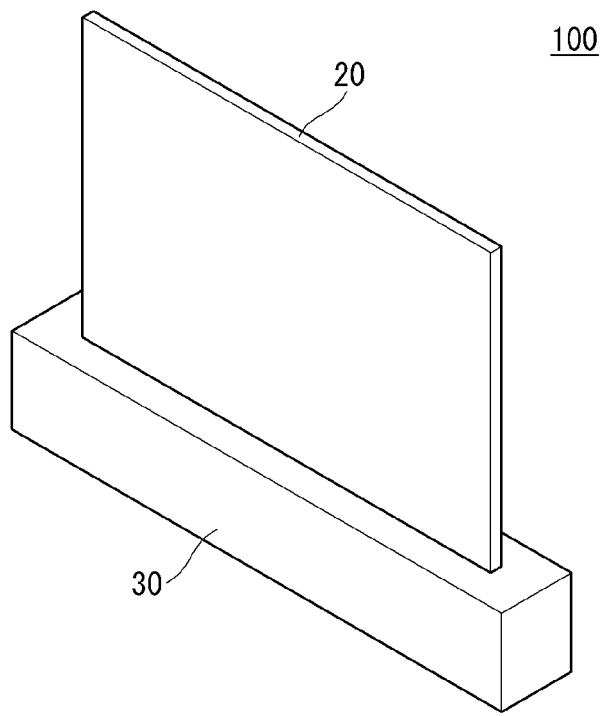
FIGS. 1 to 25 are diagrams illustrating examples of a display device according to embodiments of the present disclosure.
Figure 1:
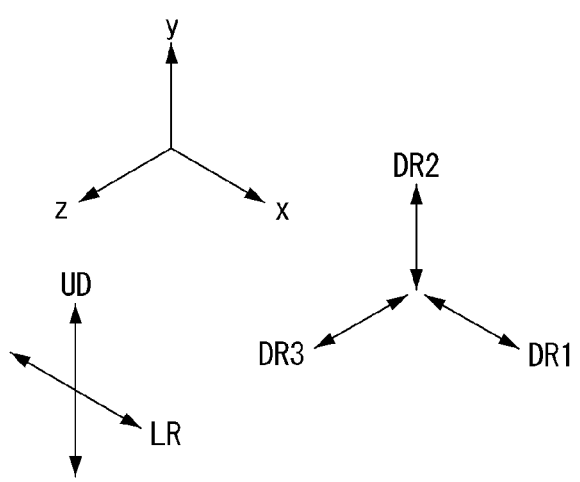

Description will now be given in detail according to exemplary embodiments disclosed herein, with reference to the accompanying drawings. For the sake of brief description with reference to the drawings, the same or equivalent components may be denoted by the same reference numbers, and description thereof will not be repeated.

In general, suffixes such as "module" and "unit" may be used to refer to elements or components. Use of such suffixes herein is merely intended to facilitate description of the specification, and the suffixes do not have any special meaning or function.

In the present disclosure, that which is well known to one of ordinary skill in the relevant art has generally been omitted for the sake of brevity. The accompanying drawings are used to assist in easy understanding of various technical features and it should be understood that the embodiments presented herein are not limited by the accompanying drawings. As such, the present disclosure should be construed to extend to any alterations, equivalents and substitutes in addition to those which are particularly set out in the accompanying drawings.

It will be understood that although the terms first, second, etc. may be used herein to describe various elements, these elements should not be limited by these terms. These terms are only used to distinguish one element from another.

It will be understood that when an element is referred to as being "connected with" another element, there may be intervening elements present. In contrast, it will be understood that when an element is referred to as being "directly connected with" another element, there are no intervening elements present.

A singular representation may include a plural representation unless context clearly indicates otherwise.

In the following description, even if the embodiment is described with reference to specific drawings, if necessary, reference numerals not appearing in the specific drawings may be referred to, and reference numerals not appearing in the specific drawings are used in a case where the above reference numerals appear in the other figures.

Referring to FIG. 1, a display device 100 may include a display unit 20 and a housing 30. The housing 30 may have an internal space. At least a portion of the display unit 20 may be located inside the housing 30. At least a portion of the display unit 20 may be located outside the housing 30. The display unit 20 may display a screen.

A direction parallel to the length direction of the housing 30 may be referred to as a first direction DR1, a +x-axis direction, a −x-axis direction, a left direction, or a right direction. A direction in which the display unit 20 displays a screen may be referred to as a +z axis, a front side direction, or a forward direction. A direction opposite to the direction in which the display unit 20 displays a screen may be referred to as a −z axis, a rear side direction, or a rearward direction. A third direction DR3 may be parallel to the +z-axis direction or the −z-axis direction. A direction parallel to a height direction of the display device 100 may be referred to as a second direction DR2, a +y-axis direction, a-y-axis direction, an upper direction, or a lower direction.

The third direction DR3 may be a direction perpendicular to the first direction DR1 and/or the second direction DR2. The first direction DR1 and the second direction DR2 may be collectively referred to as a horizontal direction. In addition, the third direction DR3 may be referred to as a vertical direction. The left-right direction LR may be parallel to the first direction DR1, and the up-down direction UD may be parallel to the second direction DR2.

Figure 2:
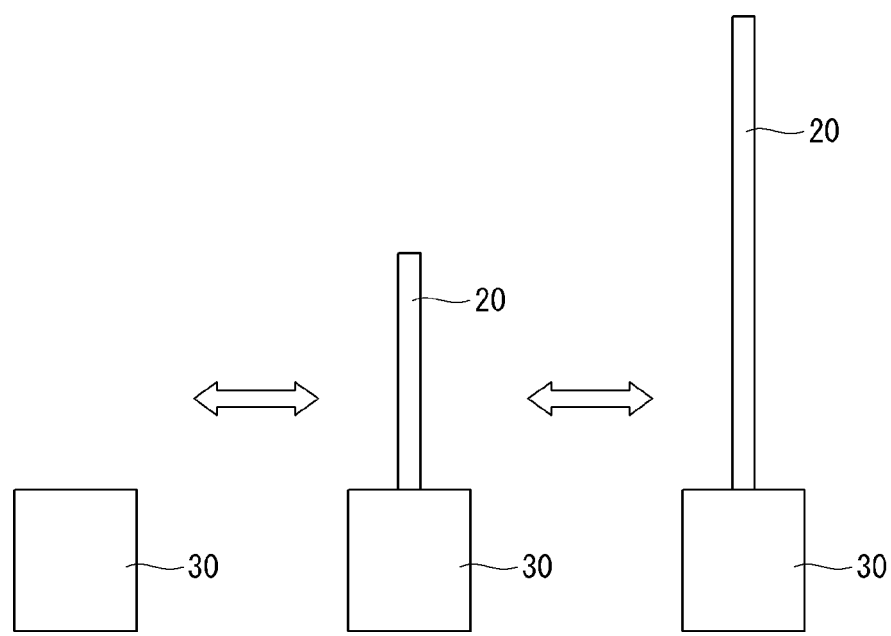

Referring to FIG. 2, the entire display unit 20 may be located inside the housing 30. At least a portion of the display unit 20 may be located outside the housing 30. The extent to which the display unit 20 is exposed to the outside of the housing 30 may be adjusted as necessary.

Figure 3:
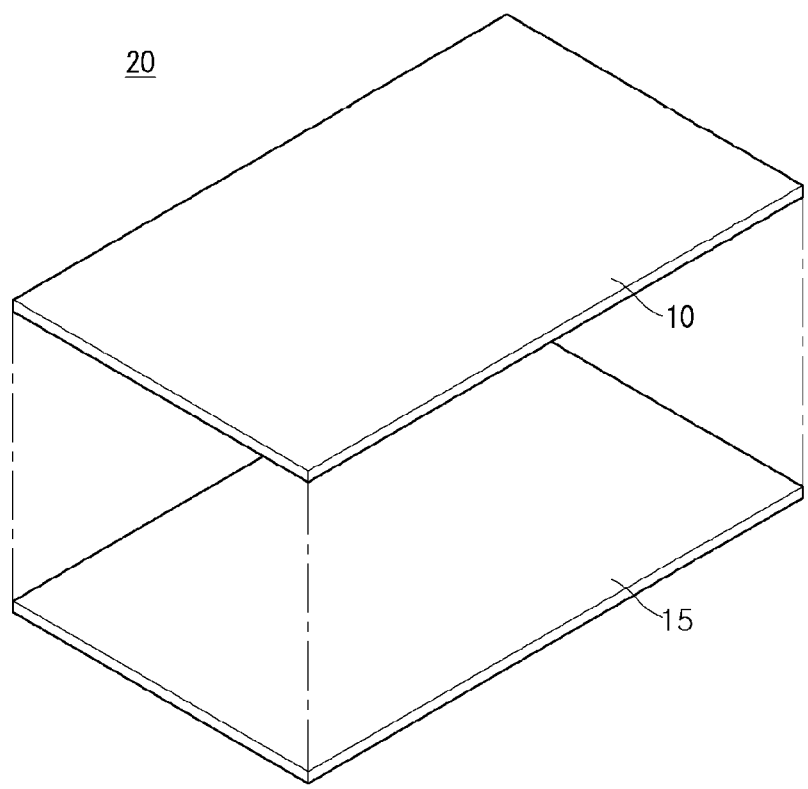

Referring to FIG. 3, the display unit 20 may include a display panel 10 and a plate 15. The display panel 10 may be flexible. For example, the display panel 10 may be an organic light emitting display (OLED).

The display panel 10 may have a front surface for displaying an image. The display panel 10 may have a rear surface opposite to the front surface. The front surface of the display panel 10 may be covered with a light-transmitting material. For example, the light-transmitting material may be a synthetic resin or a film.

The plate 15 may be coupled, fastened, or attached to the rear surface of the display panel 10. The plate 15 may include a metal material. The plate 15 may be referred to as a module cover 15, a cover 15, a display panel cover 15, a panel cover 15, or an apron 15.

Figure 4:
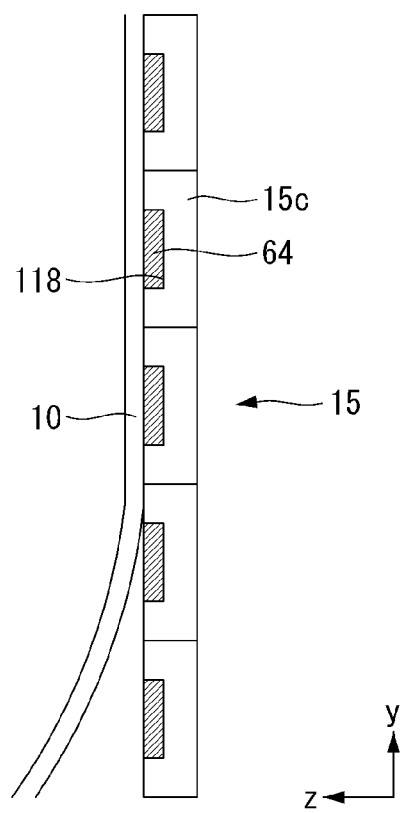

Referring to FIG. 4, the plate 15 may include a plurality of segments 15c. A magnet 64 may be located inside a recess 118 of the segment 15c. The recess 118 may be located on a surface of the segment 15c facing the display panel 10. The recess 118 may be located in the front surface of each segment 15c. Since the magnet 64 is received inside the recess 118, the magnet 64 may not protrude out of the segment 15c. The display panel 10 may be flat without being crumpled even when it comes into contact with the segment 15c.

Figure 5:
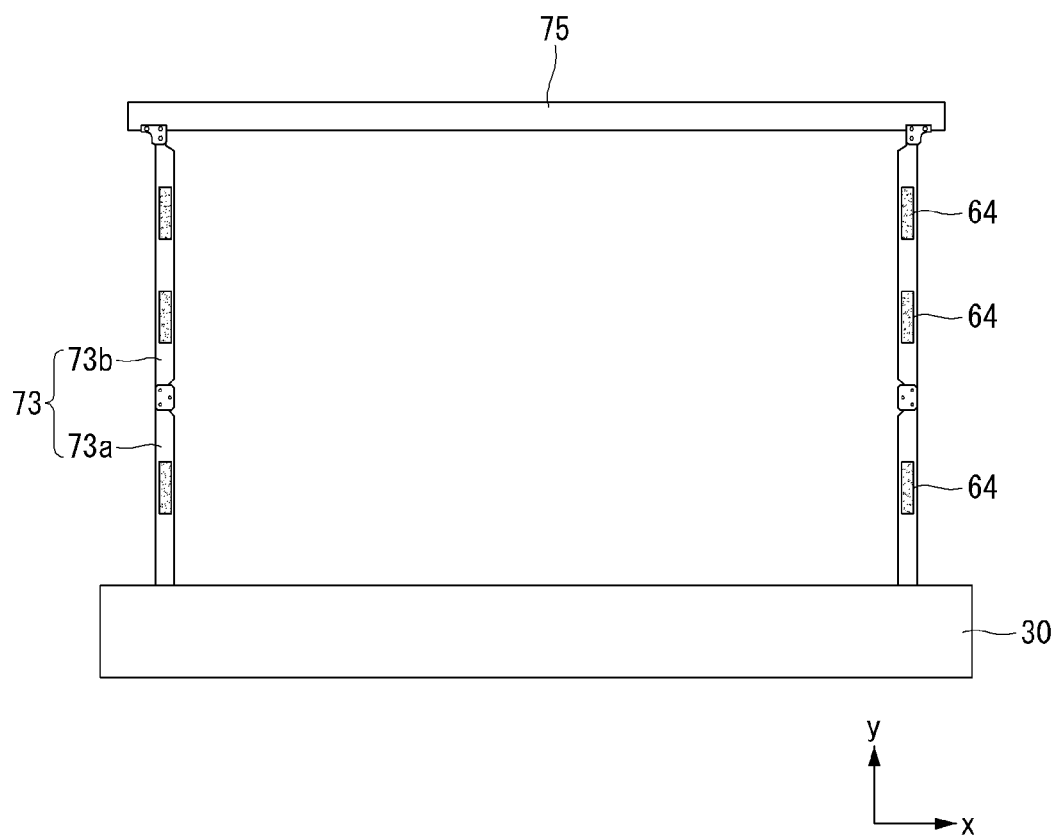

Referring to FIG. 5, a plurality of magnets 64 may be located on a link 73. For example, at least one magnet 64 may be located on a first arm 73a and at least one magnet 64 may be located on a second arm 73b. The plurality of magnets 64 may be spaced apart from each other.

Figure 6:
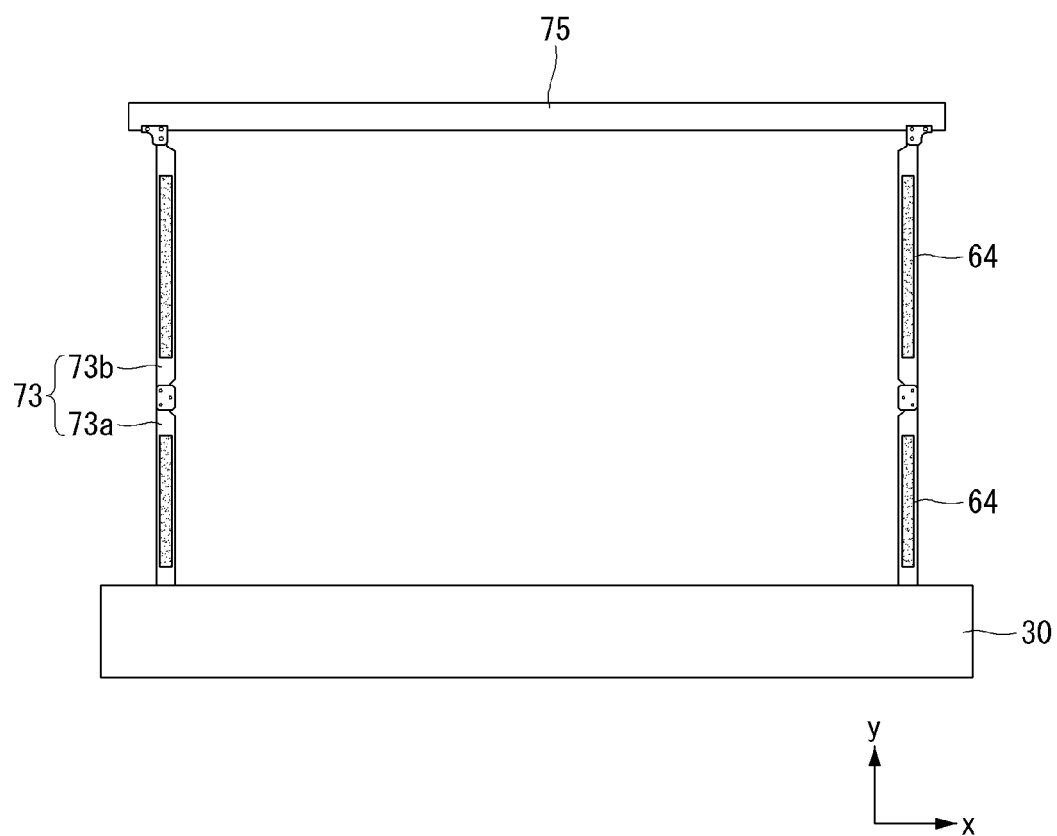

Referring to FIG. 6, one magnet 64 may be located on each of the first arm 73a and the second arm 73b. The magnet 64 may have a shape extending long in the long side direction of the first arm 73a and the second arm 73b. Since the magnet 64 has a shape extending long in the long side direction of the first arm 73a and the second arm 73b, an area of a portion where the link 73 is in close contact with the display panel and the module cover may be increased. Accordingly, the adhesion between the link 73 and the display panel and the module cover can be strong.

Figure 7:
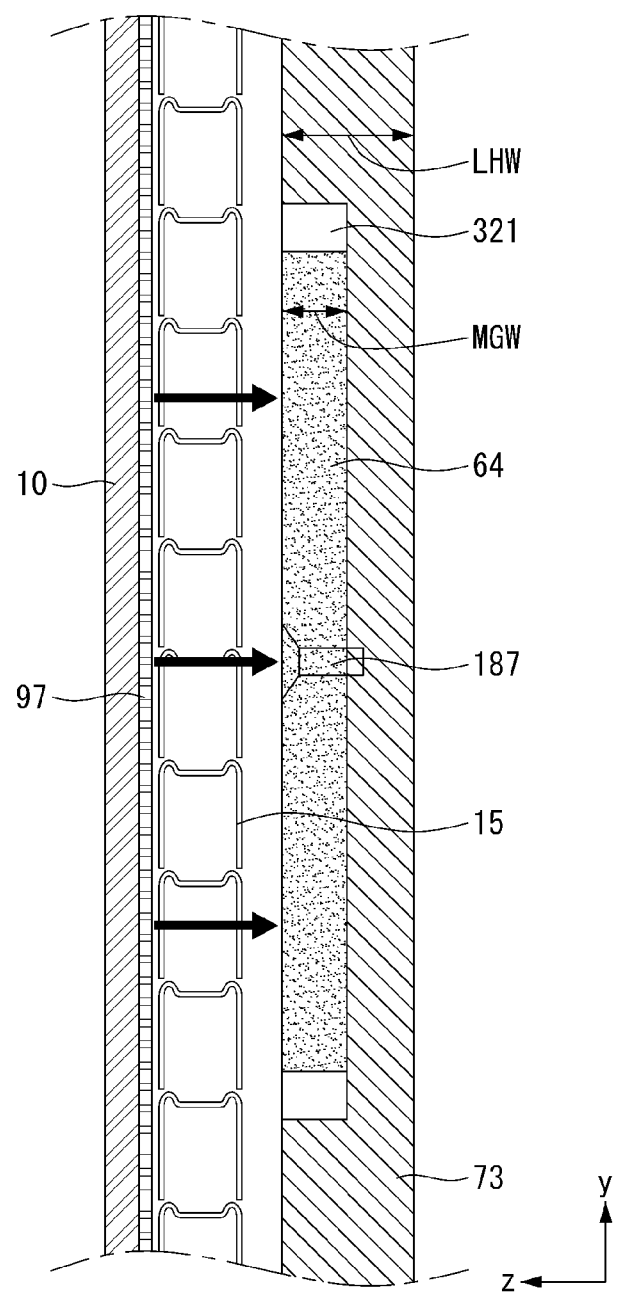

Referring to FIG. 7, the magnet 64 may be located in a recessed portion 321 formed on the link 73. The recessed portion 321 may have a shape recessed into the inside of the link 73. The magnet 64 may be coupled to the link 73 through at least one screw 187.

A width LHW at which the recessed portion 321 is recessed into the inside of the link 73 may be equal to or greater than a thickness MGW of the magnet 64. If the thickness MGW of the magnet 64 is greater than the width LHW of the recessed portion 321, the display panel 10 and the module cover 15 may not be in close contact with the link 73. In this case, the display panel 10 may be crumpled or not flat.

A panel protection portion 97 may be located on the rear surface of the display panel 10. The panel protection portion 97 may prevent the display panel 10 from being damaged due to friction with the module cover 15. The panel protection portion 97 may include a metal material. The panel protection portion 97 may have a very thin thickness. For example, the panel protection portion 97 may have a thickness of about 0.1 mm.

Since the panel protection portion 97 includes a metal material, mutual attraction with the magnet 64 may act. Accordingly, the module cover 15 located between the panel protection portion 97 and the link 73 may be in close contact with the magnet 64 even if it does not include a metal material.

Figure 8:
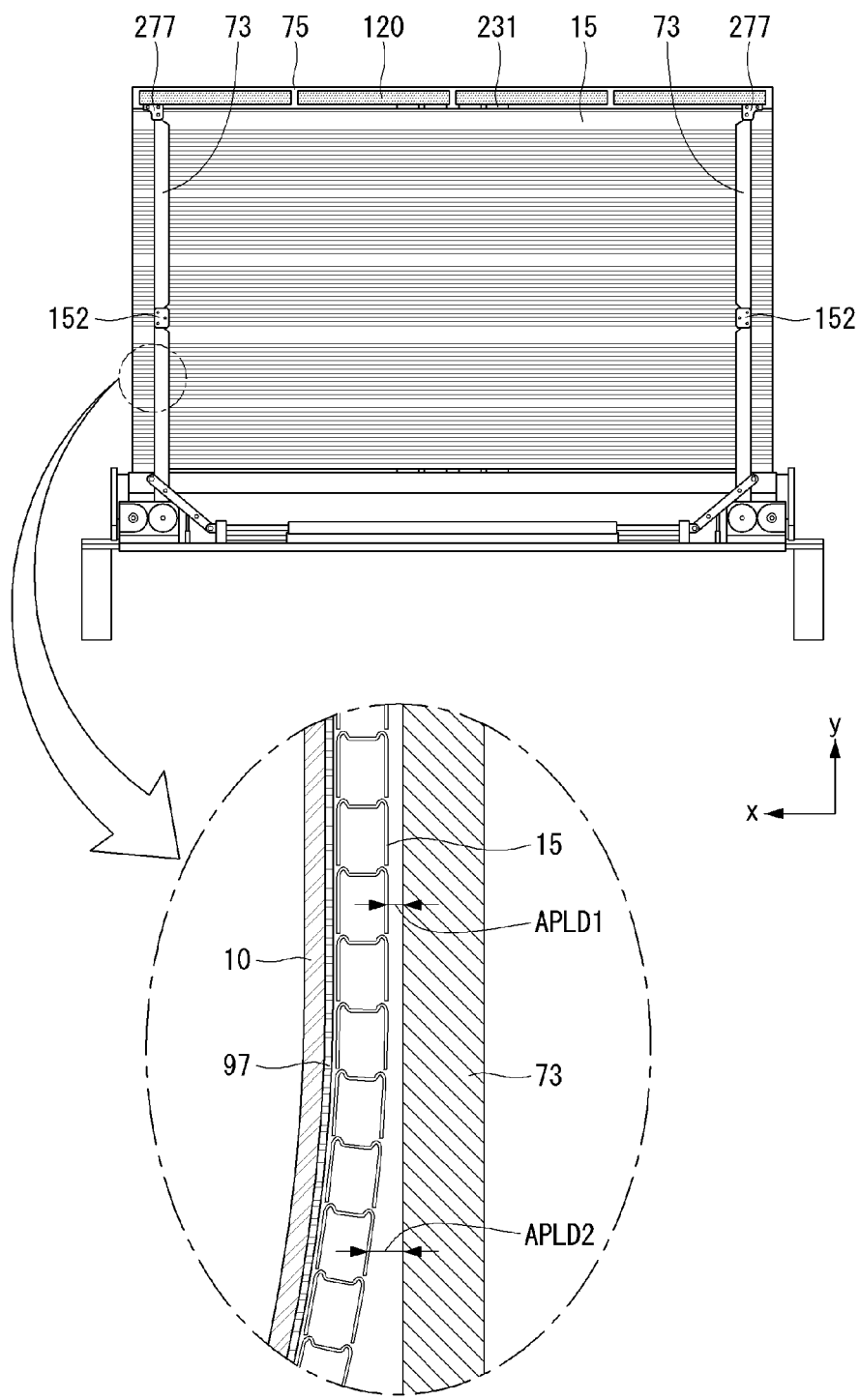
Figure 15:
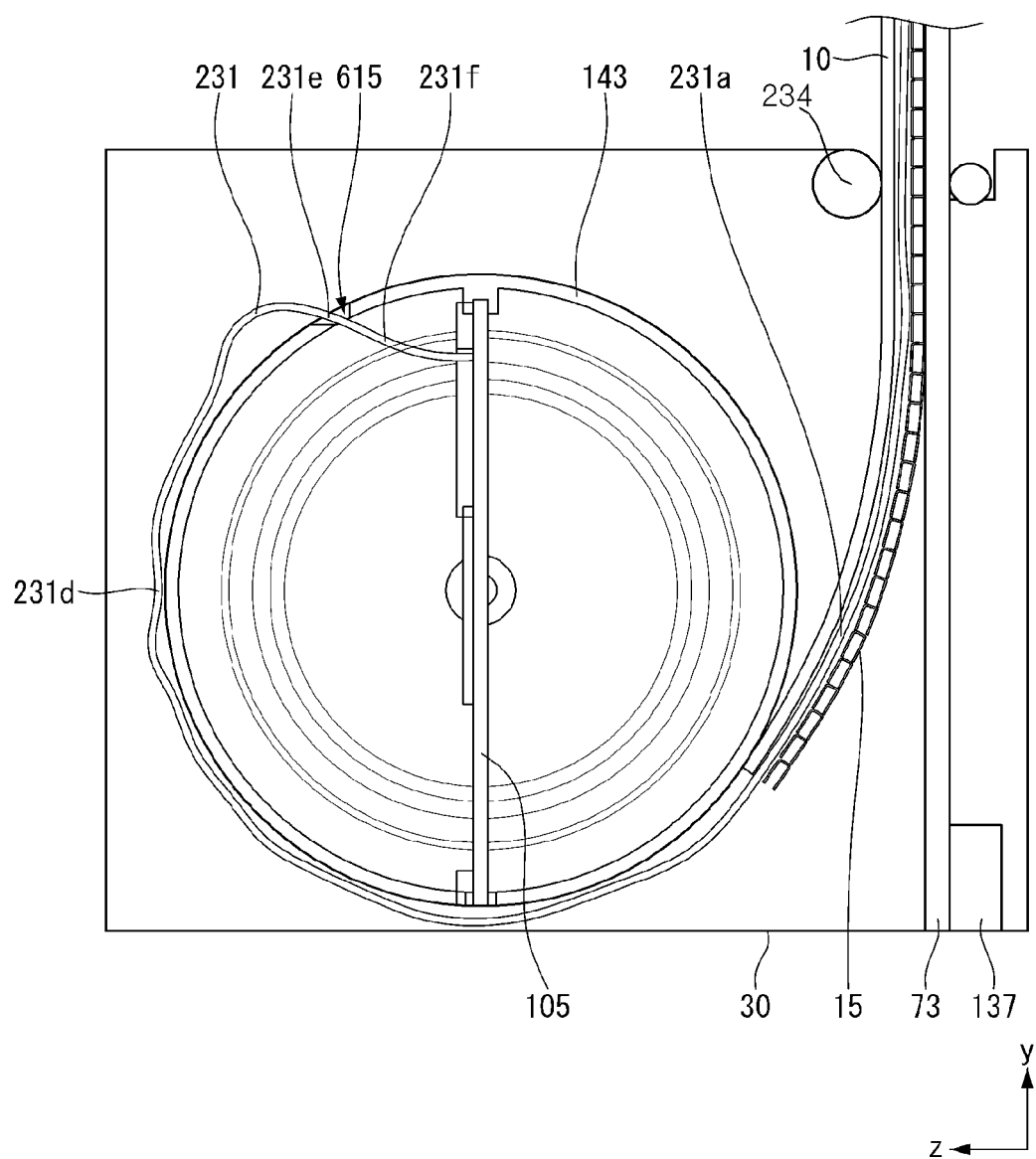

Referring to FIG. 8, the module cover 15 may be in close contact with the link 73 by an upper bar 75 in the upper side and a guide bar 234 in the lower side (see FIG. 15). A portion of the link 73 between the upper bar 75 and the guide bar 234 may not be in close contact with the module cover 15. Alternatively, a central portion of the link 73 may not be in close contact with the module cover 15. The central portion of the link 73 may be near an arm joint 152. In this case, a distance (APRD1, APLD2) between the module cover 15 and the link 73 may not be uniform. In this case, the display panel 10 may be bent or crooked.

Figure 9:
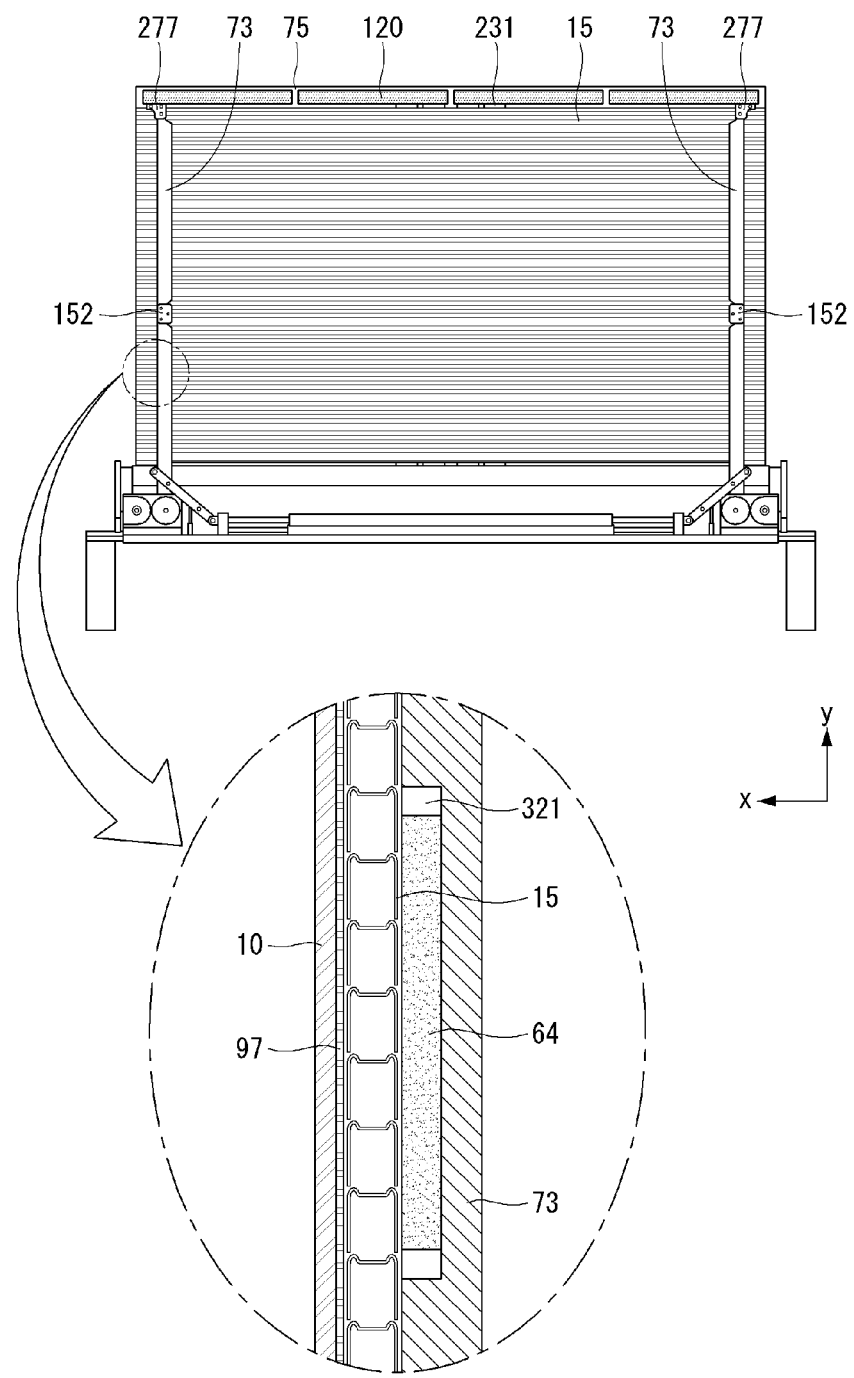

Referring to FIG. 9, when the magnet 64 is located in the recessed portion 321 of the link 73, the magnet 64 attracts the panel protection portion 97, so the module cover 15 may also be in close contact with the magnet64 at the same time. That is, the central portion of the link 73 may be in close contact with the module cover 15.

Figure 10:
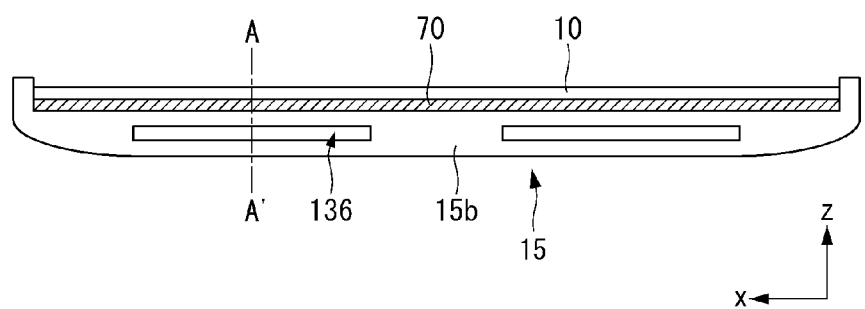
Figure 10:
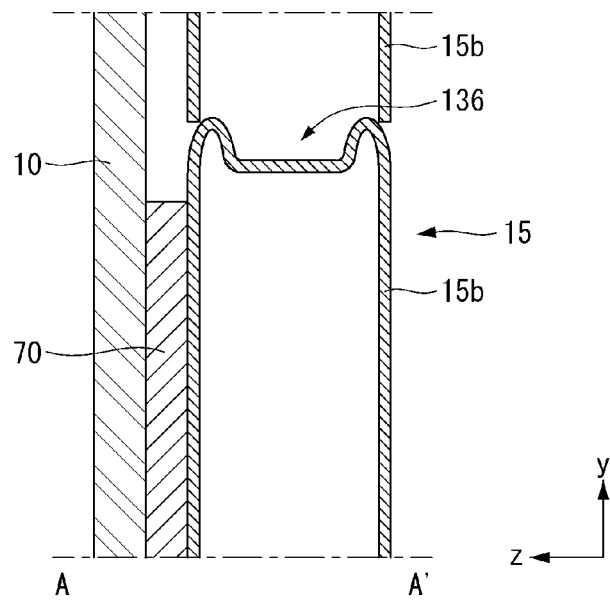

Referring to FIG. 10, a bead 136 may be formed on the upper surface of the segment 15b. The bead 136 may have a shape recessed into the inside of the segment 15b. The bead 136 may have a shape recessed in the −y-axis direction. For example, the bead 136 may be formed by pressing the segment 15b. A plurality of beads 136 may be formed on the segment 15b. The plurality of beads 136 may be spaced apart from each other. The bead 136 may improve the rigidity of the segment 15b. The bead 136 may prevent the shape of the segment 15b from being deformed from an external impact. The segment 15b may be fixed to the rearward direction of the display panel 10 by an adhesive member 70. A panel protection portion 97 (see FIG. 8) may be located between the adhesive member 70 and the display panel 10. For example, the adhesive member 70 may be a double-sided tape.

Figure 11:
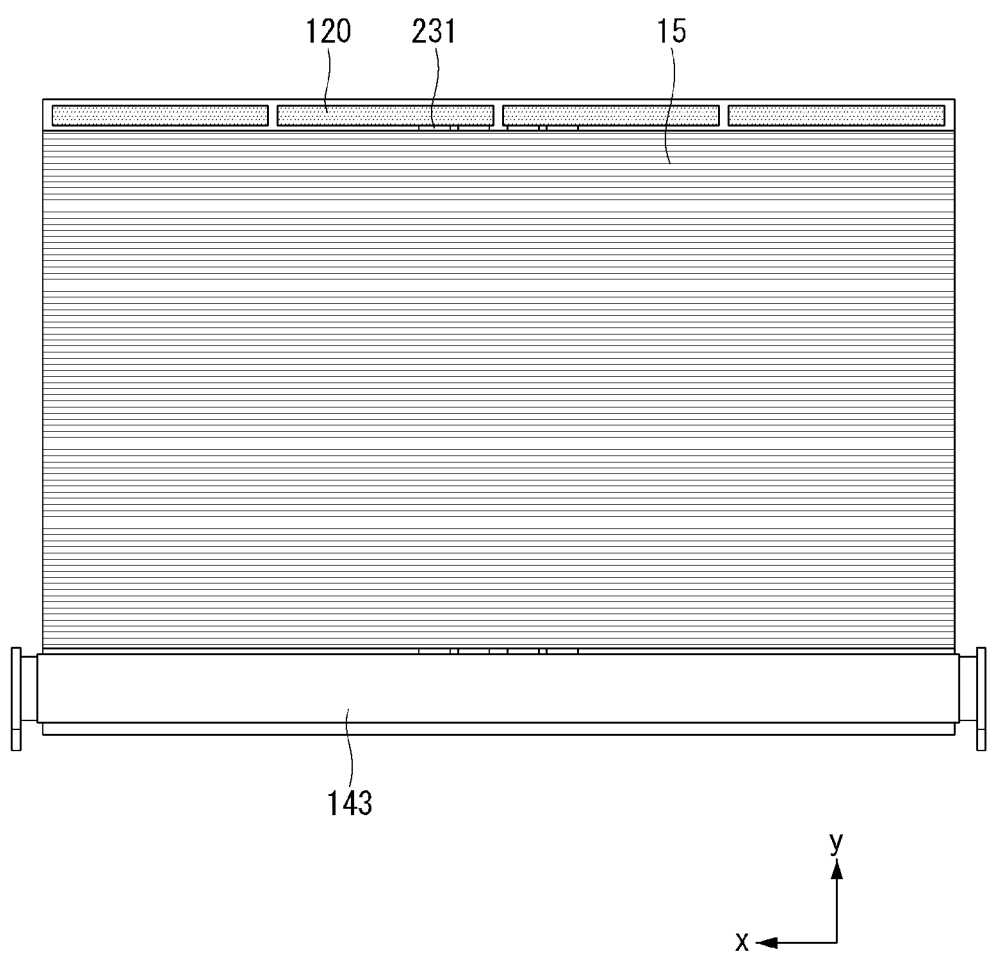

Referring to FIG. 11, a source PCB 120 may be located in the upper side of the module cover 15. When the source PCB 120 is rolled up or rolled down, the position may change with the movement of the module cover 15. A FFC cable 231 may be located in the center portion of the module cover 15 based on a first direction. The FFC cable 231 may be located in opposite ends of the module cover 15 based on the first direction.

Figure 12:
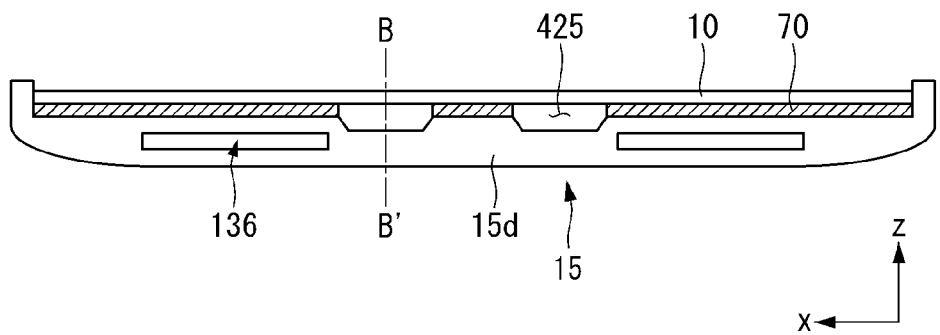
Figure 12:
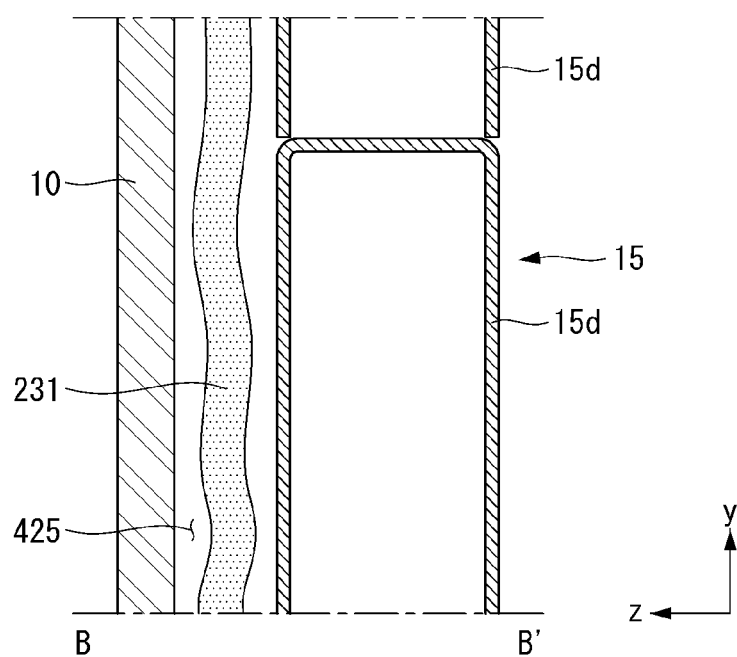

Referring to FIG. 12, the segment 15d may include a recessed portion 425 that is recessed in the −z-axis direction.

The recessed portion 425 may form a space between the display panel 10 and the module cover 15.

The FFC cable 231 may be received in a space formed by the recessed portion 425. In addition, the recessed portion 425 may improve the rigidity of the segment 15d.

The bead 136 may be located on the segment 15d excluding a portion where the recessed portion 425 is located. The bead 136 may not be located in the portion where the recessed portion 425 is located because the thickness of the segment 15d in a third direction becomes thinner.

Figure 13:
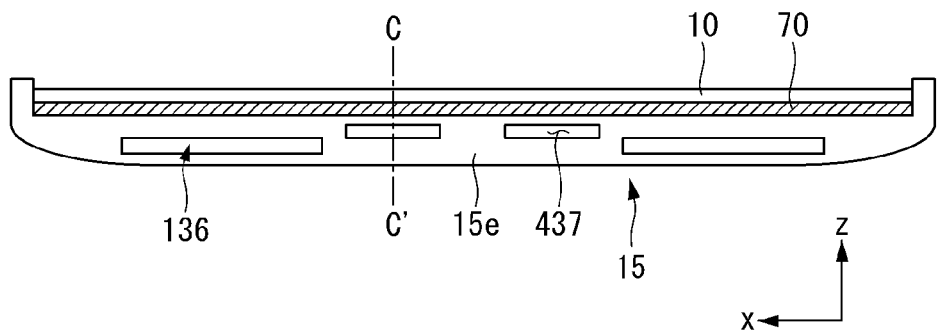
Figure 13:
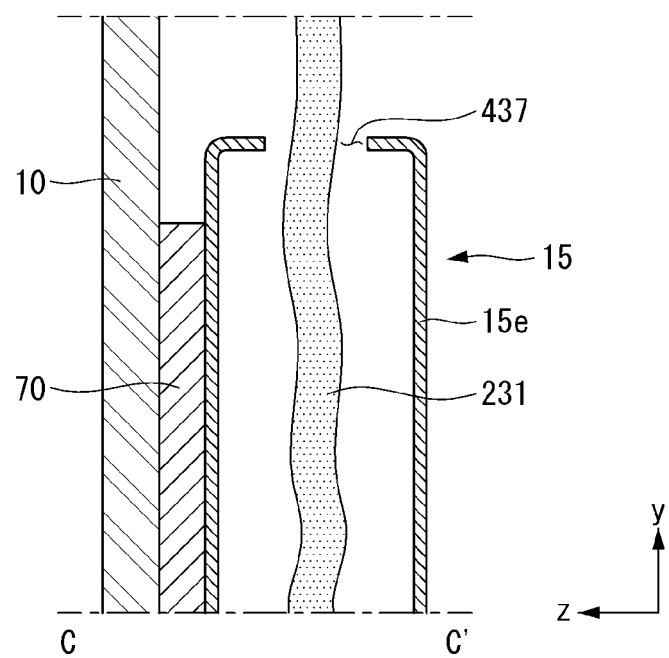

Referring to FIG. 13, a penetrating portion 437 may be located in the center portion of the segment 15e in the first direction. The penetrating portion 437 may penetrate the central portion of the segment 15e in the second direction. That is, the penetrating portion 437 may be a hole located in the segment 15e. The penetrating portion 437 may be a portion in which the FFC cable 231 is located. Since the penetrating portion 437 is formed inside the segment 15e, the thickness of the segment 15e may be reduced compared to a case where the FFC cable 231 located in the recessed portion 425.

The bead 136 may be located on the segment 15e excluding the portion where the penetrating portion 437 is located. The bead 136 may not be located in the portion where the penetrating portion 437 is located because the thickness of the segment 15e in the third direction becomes thinner.

Figure 14:
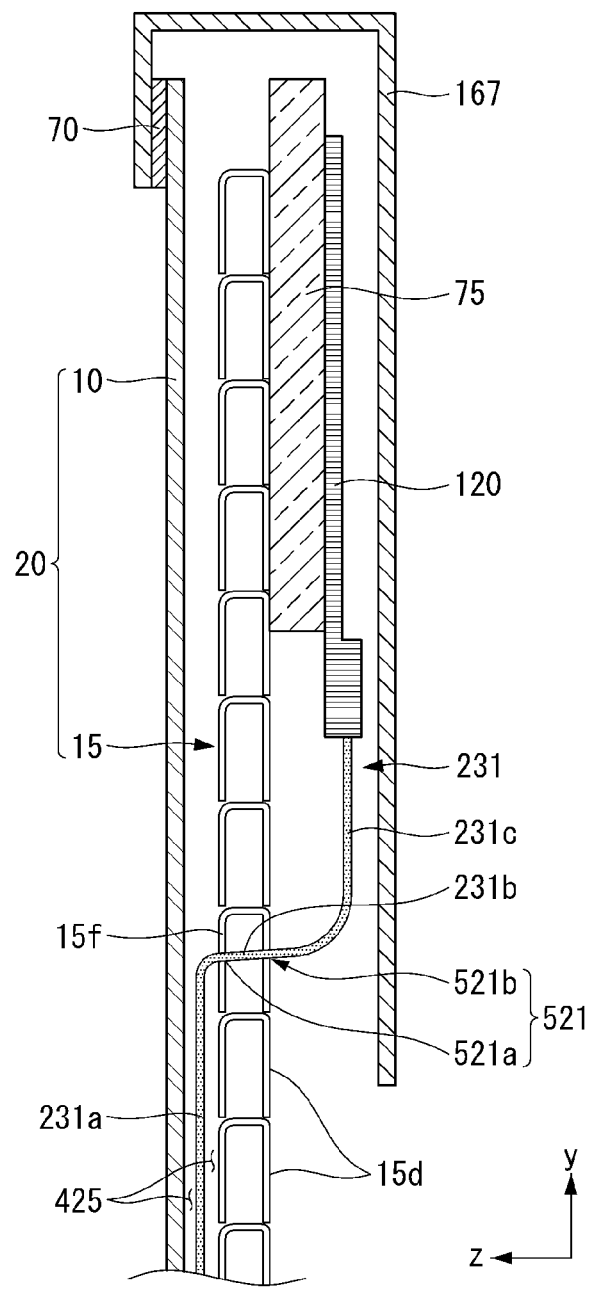

Referring to FIG. 14, a top case 167 may cover the source PCB 120 and the upper bar 75 as well as the display panel 10 and the module cover 15. One surface of the upper bar 75 may be coupled to the rear surface of the module cover 15, and the other surface may be coupled to the source PCB 120. The upper bar 75 may be fixed to the module cover 15 to support the source PCB 120.

The lower end of the FFC cable 231 may be connected to a timing controller board 105 (see FIG. 15) inside a panel roller 143 (see FIG. 15). The FFC cable 231 may be wound on or unwound from the panel roller 143 together with the display unit 20.

A portion of the FFC cable 231 may be located between the display panel 10 and the module cover 15. A portion of the FFC cable 231 located between the display panel 10 and the module cover 15 may be referred to as a first portion 231a. The first portion 231a may be located in the recessed portion 425 formed by the plurality of segments 15d. Alternatively, the first portion 231a may be received in the recessed portion 425 formed by the plurality of segments 15d.

A portion of the FFC cable 231 may penetrate the segment 15f. A portion of the FFC cable 231 penetrating the segment 15f may be referred to as a second portion 231b. The segment 15f may include a first hole 521a formed on the front surface and a second hole 521b formed on the rear surface. The first hole 521a and the second hole 521b may be interconnected to form one hole 521. The hole 521 may penetrate the segment 15f in the third direction. The second portion 231b may penetrate the hole 521. The hole 521 may be referred to as a connection hole 521.

An upper end of the FFC cable 231 may be electrically connected to the source PCB 120. A portion of the FFC cable 231 may be located on the rear surface of the module cover 15. A portion of the FFC cable 231 located on the rear surface of the module cover 15 may be referred to as a third portion 231c. The third portion 231c may be electrically connected to the source PCB 120.

The third portion 231c may be covered by the top case 167. Accordingly, the third portion 231c may not be exposed to the outside.

Referring to FIG. 15, the FFC cable 231 may be connected to the timing controller board 105 mounted in the panel roller 143. A through hole 615 may be formed on the panel roller 143, and the FFC cable 231 may be connected to the timing controller board 105 through the through hole 615.

The through hole 615 may be located in one side of the panel roller 143 and may penetrate an outer circumferential portion of the panel roller 143. The FFC cable 231 may be connected to one side of the timing controller board 105 through the through hole 615.

Even when the FFC cable 231 is located on the outer circumference of the panel roller 143, the connection to the timing controller board 105 may be maintained due to the through hole 615. Accordingly, the FFC cable 231 may not be twisted by rotating together with the panel roller 143.

A portion of the FFC cable 231 may be wound around the panel roller 143. A portion of the FFC cable 231 wound around the panel roller 143 may be referred to as a fourth portion 231d. The fourth portion 231d may be in contact with the outer circumferential surface of the panel roller 143.

A portion of the FFC cable 231 may penetrate the through hole 615. A portion of the FFC cable 231 passing through the through hole 615 may be referred to as a fifth portion 231e.

A lower end of the FFC cable 231 may be electrically connected to the timing controller board 105. A portion of the FFC cable 231 may be located inside the panel roller 143. A portion of the FFC cable 231 located inside the panel roller 143 may be referred to as a sixth portion 231f. The sixth portion 231f may be electrically connected to the timing controller board 105.

Figure 16:
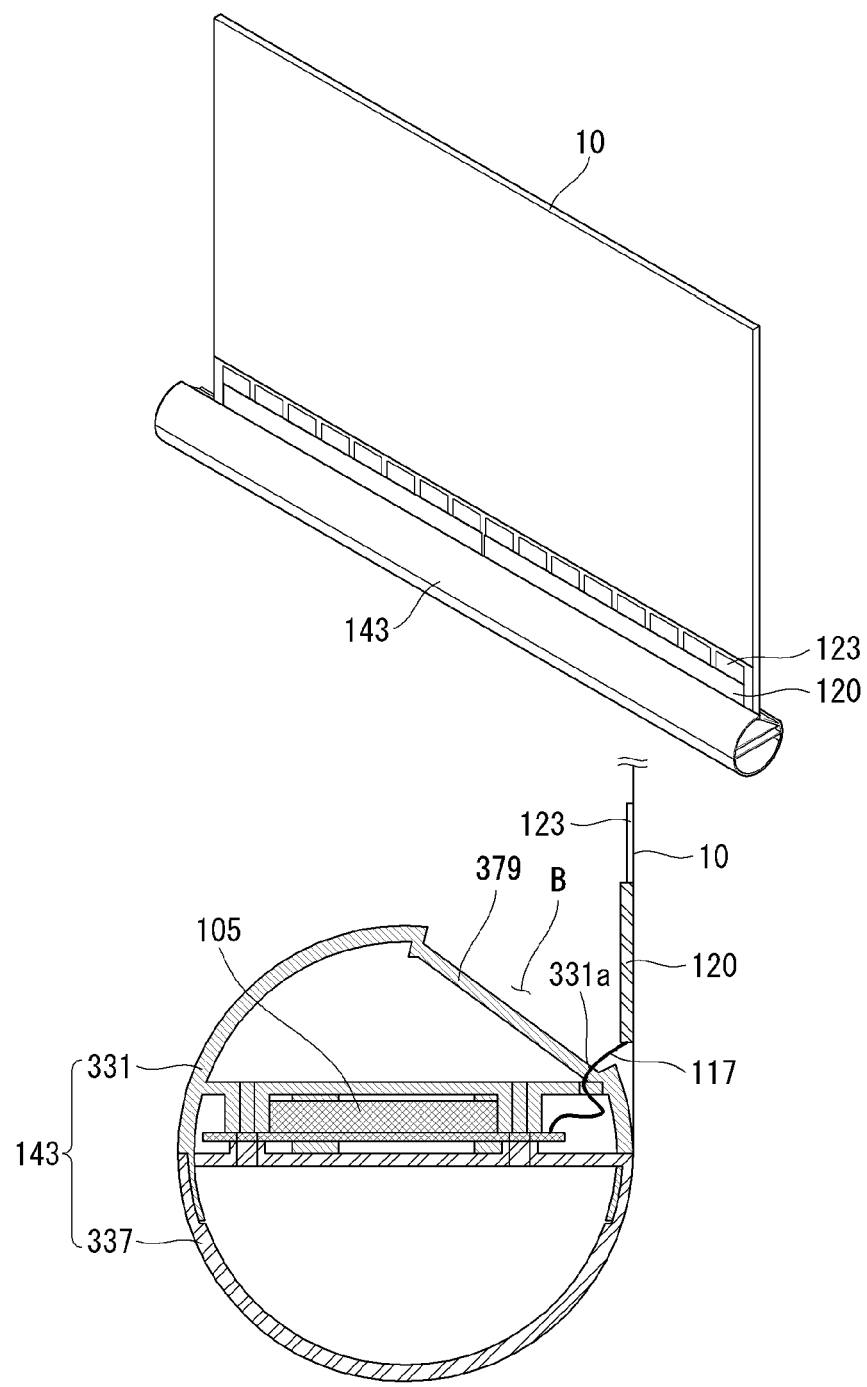

Referring to FIG. 16, the lower end of the display panel 10 may be connected to the roller 143. The display panel 10 may be wound on or unwound from the roller 143. The front surface of the display panel 10 may be coupled to a plurality of source PCBs 120. The plurality of source PCBs 120 may be spaced apart from each other.

The source chip on film (COF) 123 may connect the display panel 10 and the source PCB 120. The source COF 123 may be located in the front surface of the display panel 10. The roller 143 may include a first part 331 and a second part 337. The first part 331 and the second part 337 may be fastened by a screw. The timing controller board 105 may be mounted inside the roller 143.

The source PCB 120 may be electrically connected to the timing controller board 105. The timing controller board 105 may transmit digital video data and a timing control signal to the source PCB 120.

The cable 117 may electrically connect the source PCB 120 and the timing controller board 105. For example, the cable 117 may be a flexible flat cable (FFC). The cable 117 may penetrate the hole 331a. The hole 331a may be formed in a seating portion 379 or the first part 331. The cable 117 may be located between the display panel 10 and the second part 337.

The seating portion 379 may be formed in the outer circumference of the first part 331. The seating portion 379 may be formed by stepping a portion of the outer circumference of the first part 331. The seating portion 379 may form a space (B). When the display unit 20 is wound around the roller 143, the source PCB 120 may be received in the seating portion 379. The source PCB 120 may be received in the seating portion 379, so that it is not bent or crooked, and durability may be improved.

The cable 117 may electrically connect the timing controller board 105 and the source PCB 120.

Figure 17:
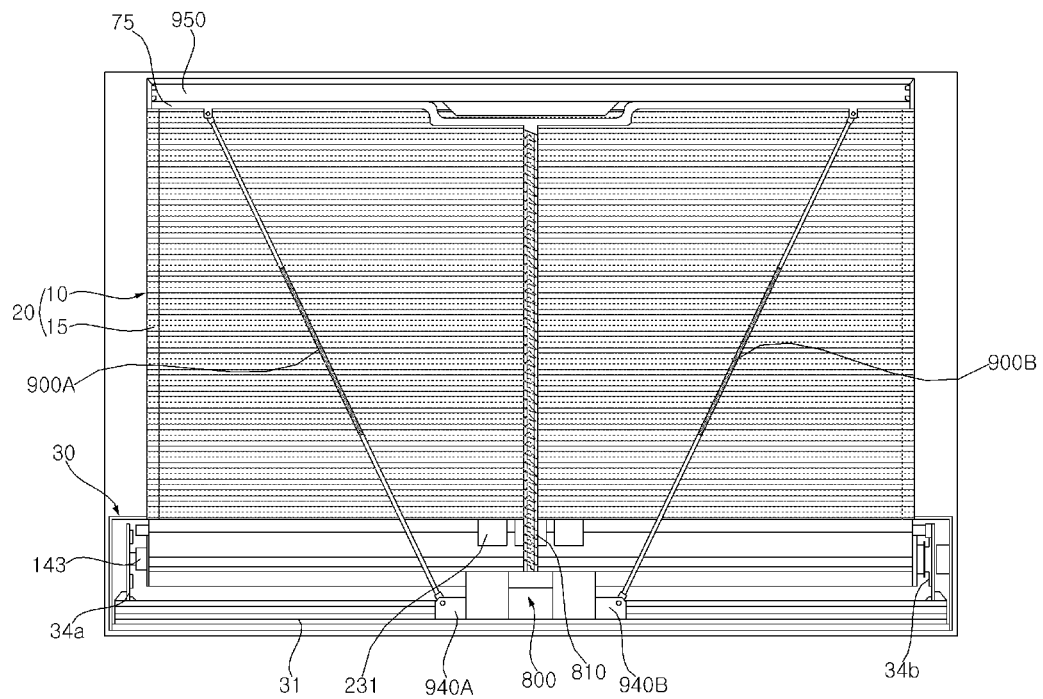

Referring to FIG. 17, the base 31 may be mounted inside the housing 30. The base 31 may be mounted on the bottom of the housing 30. The panel roller 143 may extend long in the length direction of the housing 30. The panel roller 143 on which the display unit 20 is wound may be rotatably installed in the base 31. The roller bracket 34a, 34b may be coupled to opposite ends of the base 31. One end of the panel roller 143 may be rotatably installed in a first roller bracket 34a, and the other end of the panel roller 143 may be rotatably installed in a second roller bracket 34b. As the panel roller 143 rotates in the housing 30, the display unit 20 may be wound on or unfolded from the panel roller 143.

A chain driving unit 800 may be mounted on the base 31. The chain driving unit 800 may be located between the first roller bracket 34a and the second roller bracket 34b. A plurality of chain driving units 800 may be mounted on the base 31. A chain 810 may be received inside the chain driving unit 800, and extend to the outside of the chain driving unit 800.

A stable mount 940A, 940B may be mounted on the base 31 while being adjacent to opposite sides of the chain driving unit 800. A first stable mount 940A may be mounted in the right side of the chain driving unit 800, and a second stable mount 940B may be mounted in the left side of the chain driving unit 800. The lower end of a first support bar 900A may be pivotably coupled to the first stable mount 940A, and the upper end may be pivotably coupled to the upper bar 75. A second support bar 900B may have a lower end pivotably coupled to the second stable mount 940B, and an upper end pivotably coupled to the upper bar 75. The distance between the upper end of the first support bar 900A and the upper end of the second support bar 900B may be greater than the distance between the lower end of the first support bar 900A and the lower end of the second support bar 900B. Support bars 900A and 900B may be contractible or stretchable.

The description of the first support bar 900A and the first stable mount 940A may be applied to the description of the second support bar 900B and the second stable mount 940B.

Figure 18:
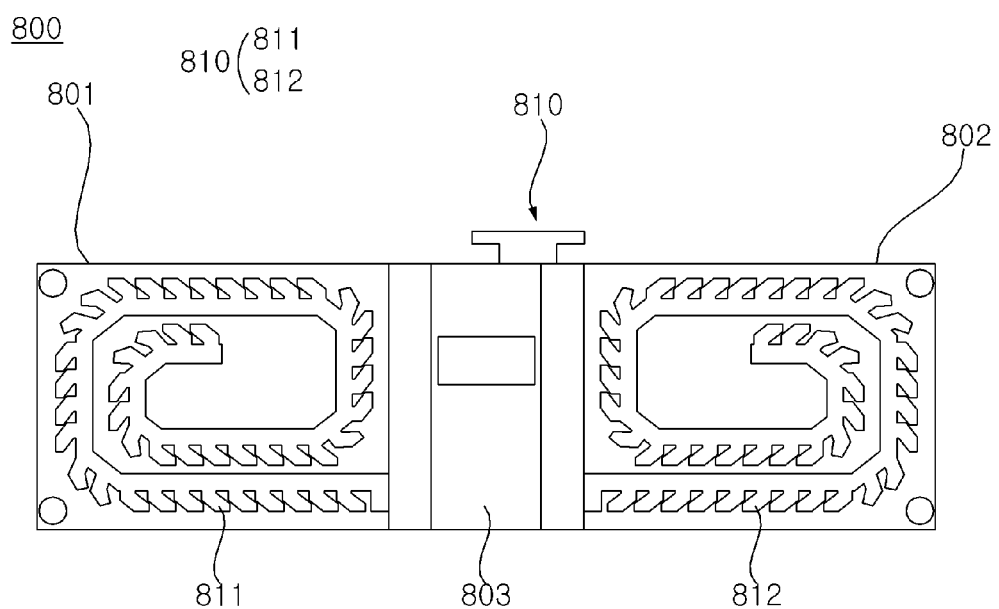

Referring to FIG. 18, the chain driving unit 800 may include a driving box 803, a first container 801, a second container 802, and chains 810, 811, and 812. The first container 801 may be located in one side of the driving box 803, and the second container 802 may be located in the other side of the driving box 803. The first container 801 may face the second container 802 with respect to the driving box 803.

The first container 801 may receive a first chain part 811. The first chain part 811 may be received in a state of being wound inside the first container 801. A second chain part 812 may be received in a state of being wound inside the second container 802. The length of the first chain part 811 may be substantially the same as the length of the second chain part 812.

Figure 19:
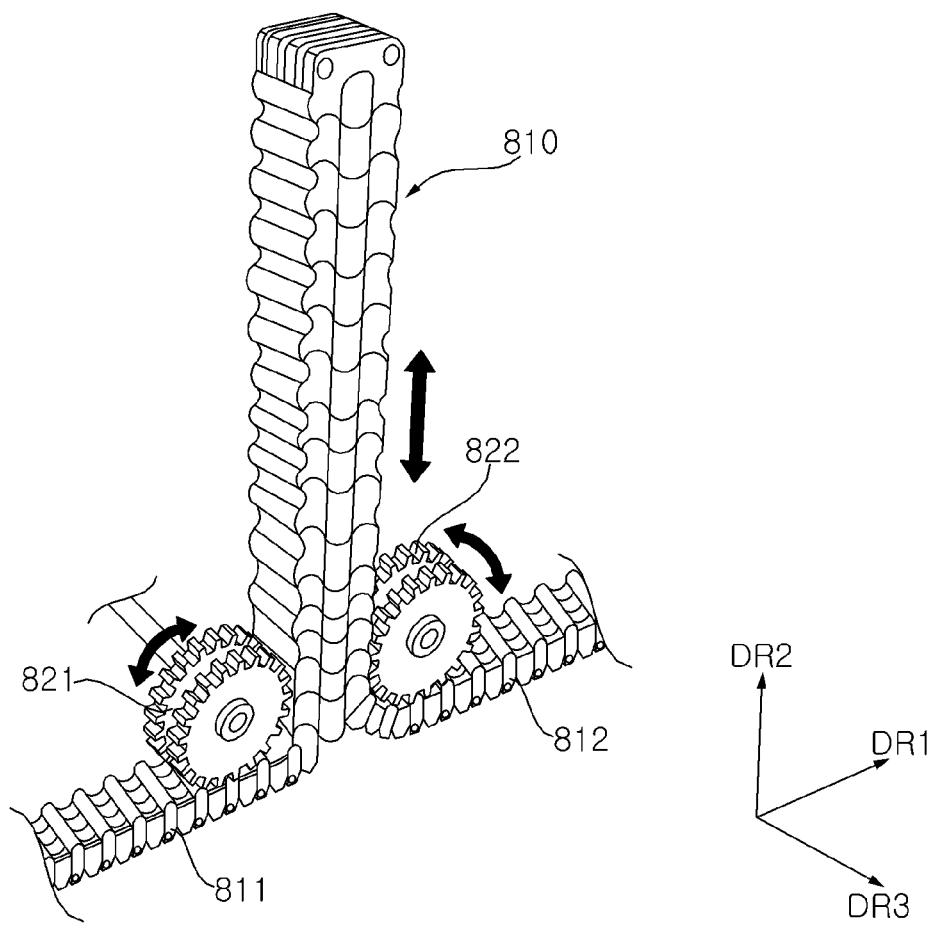

Referring to FIG. 19, a first driving gear 821 may move the first chain part 811. A second driving gear 822 may move the second chain part 812. The first driving gear 821 may mesh with the first chain part 811, and when the first driving gear 821 rotates, the first chain part 811 may mesh with the second chain part 812. The second driving gear 822 may mesh with the second chain part 812, and when the second driving gear 822 rotates, the second chain part 812 may mesh with the first chain part 811. In a state of being engaged with each other, the first chain part 811 and the second chain part 812 may move as one body. For example, the first chain part 811 may move in a horizontal direction DR1 toward each other with the second chain part 812, and the first chain part 812 and the second chain part 812 that are in a state of being engaged with each other by the driving gears 821 and 822 811 may move in a vertical direction DR2. The first chain part 811 and the second chain part 812 that are engaged with each other may maintain a standing state by themselves.

Figure 20:
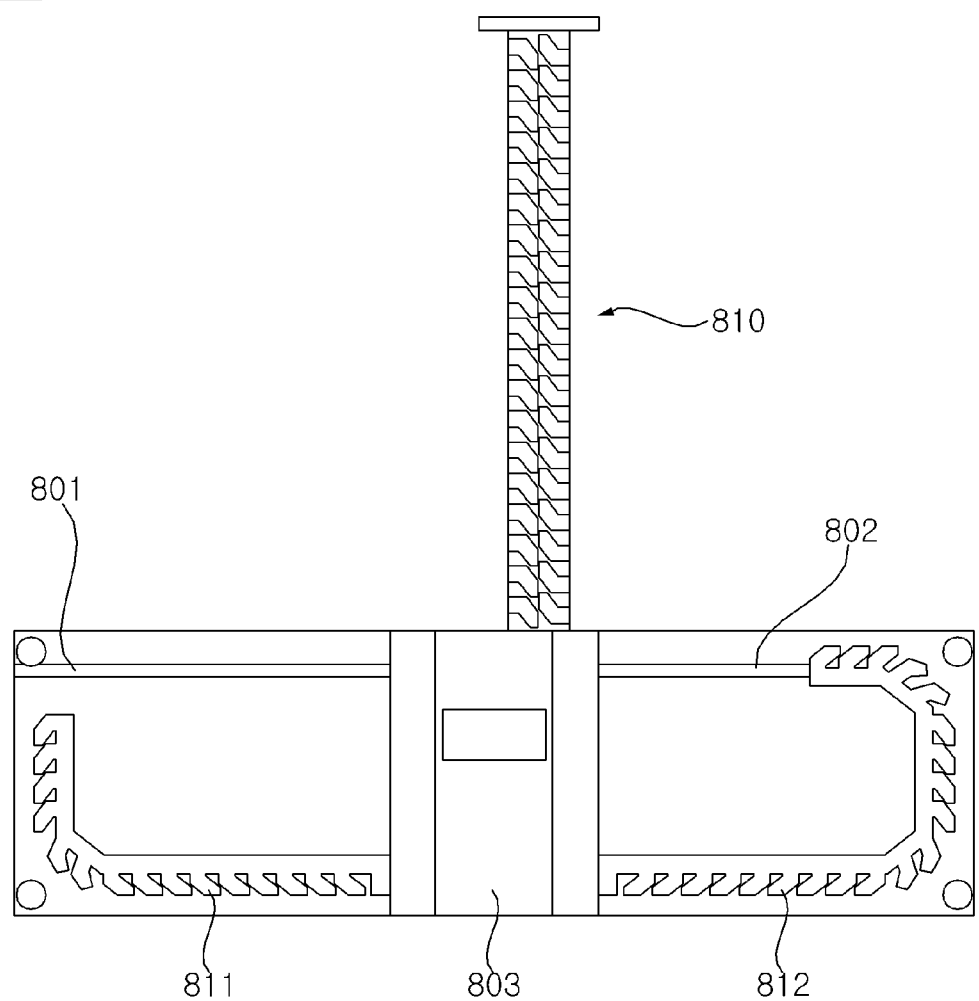

Referring to FIGS. 18 to 20, due to rotation of the first driving gear 821 and the second driving gear 822, the chain 810 may ascend upward of the driving box 803 from the upper side of the driving box 803. The chain 810 may ascend upward of the chain driving unit 800 while maintaining a standing state by coupling the first chain part 811 and the second chain part 812.

Figure 21:
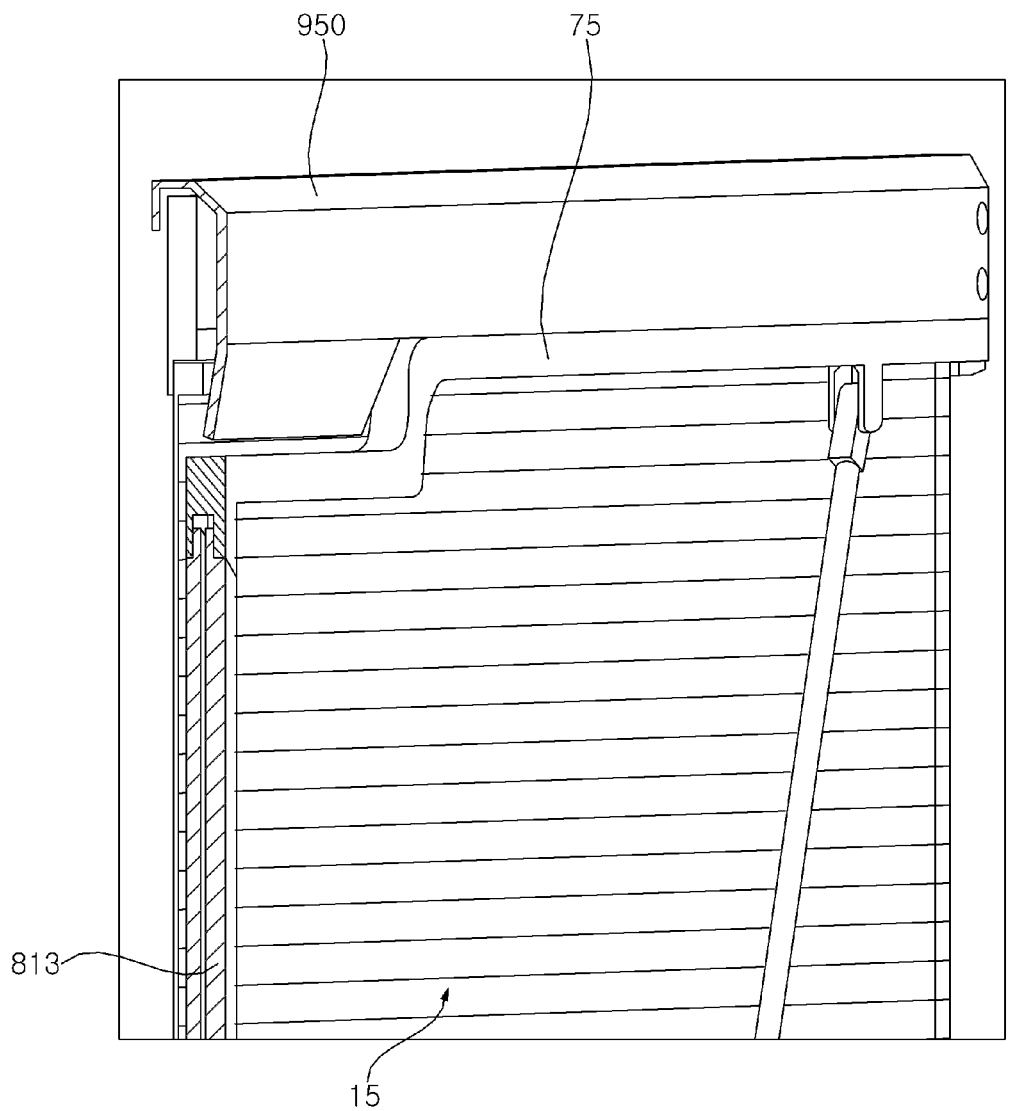

Referring to FIGS. 17 and 21, the upper end of the chain 810 may be fixed or coupled to the central portion of the upper bar 75. The upper end of the chain 810 may be fixed or coupled to opposite ends of the upper bar 75. The upper end of the chain 810 may be fixed or coupled to between one end and the central portion of the upper bar 75. A position where the upper end of the chain 810 is coupled to the upper bar 75 may be variously changed.

Figure 22:
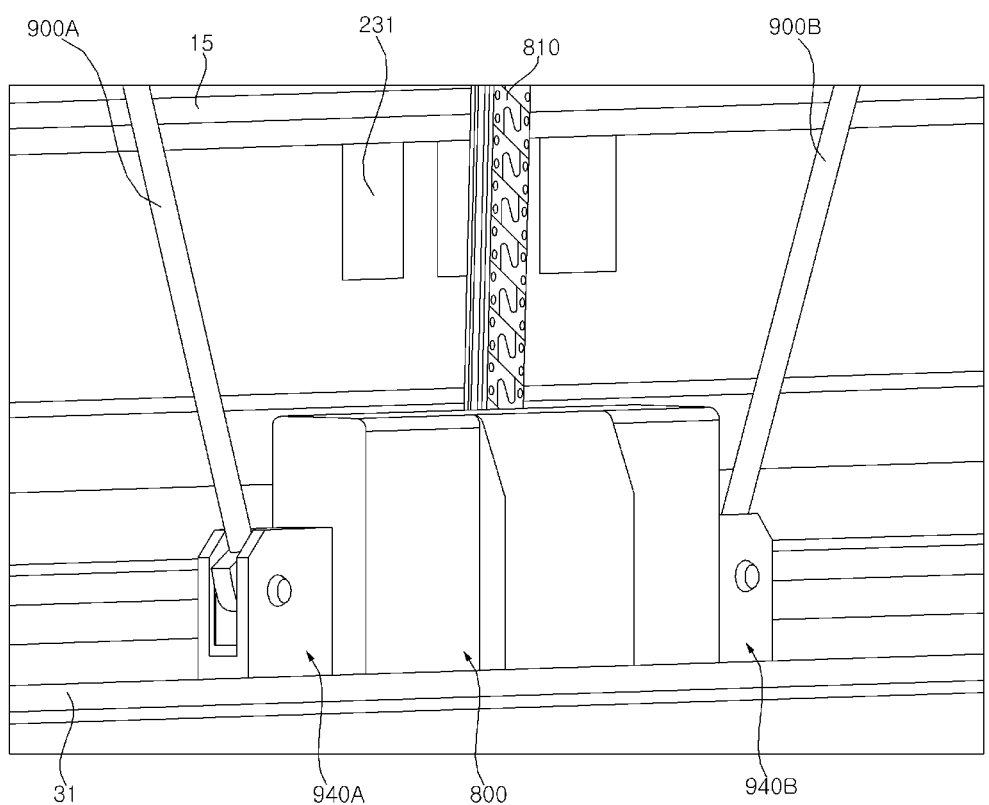

Referring to FIG. 22, the lower end of the first support bar 900A may be pivotably coupled to the first stable mount 940A. The lower end of the second support bar 900B may be pivotably coupled to the second stable mount 940B. The first support bar 900A may rotate between an angle parallel to and an angle perpendicular to the chain 810. The second support bar 900B may rotate between an angle parallel to and an angle perpendicular to the chain 810. The angle formed by the first support bar 900A and the chain 810 may be substantially the same as the angle formed by the second support bar 900B and the chain 810. When the chain 810 ascends, the first angle formed by the first support bar 900A with respect to the chain 810 and/or the second angle formed by the second support bar 900B with respect to the chain 810 may become smaller. When the chain 810 descends, the first angle and/or the second angle may increase.

Figure 23:
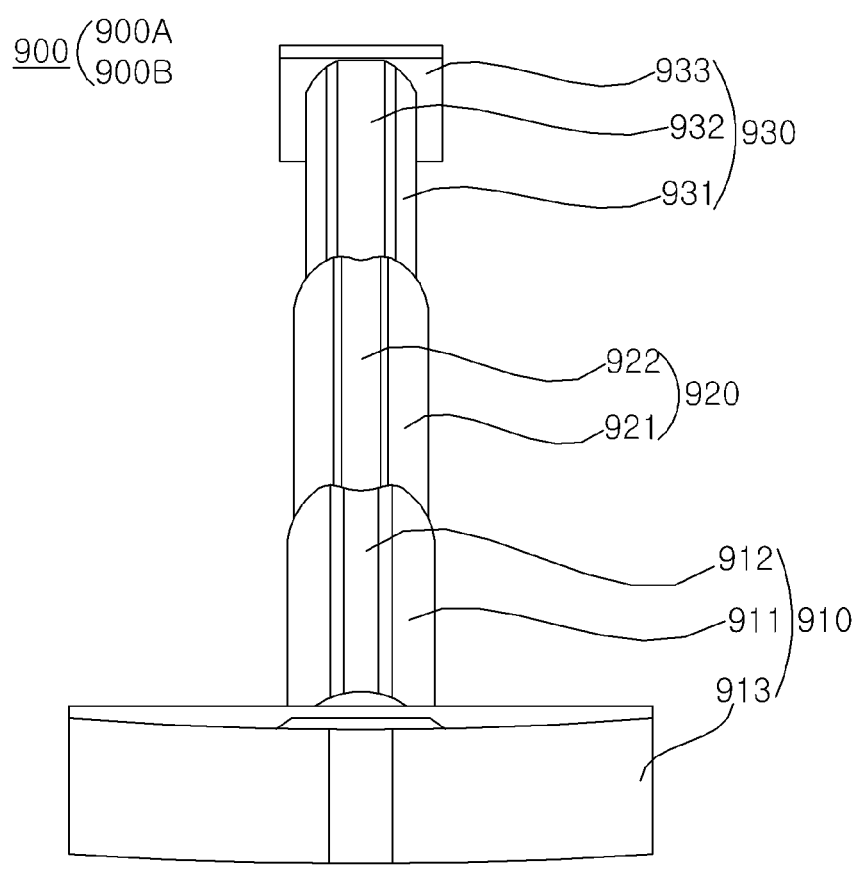

Referring to FIG. 23, the support bar 900 may be contracted and/or stretched in stages. The support bar 900 may include a first part 910, a second part 920, and a third part 930. The second part 920 may be received while being inserted into the first part 910. The third part 930 may be received while being inserted into the second part 920. The first part 910 may include a first head 913 and a first bar 911. The first head 913 may be rotatably connected or coupled to the stable mount (940A, 940B) (see FIG. 17). The first bar 911 may have a hollow pipe shape. A first trench 912 may be formed while being recessed long from the first bar 911 in the up-down direction of the first bar 911. For example, the first trench 912 may be formed while one surface of the hollow pipe is pressed.

The second part 920 may include a second bar 921. The second bar 921 may have a hollow pipe shape. A second trench 922 may be formed while being recessed long from the second bar 921 in the up-down direction of the second bar 921. For example, the second trench 922 may be formed while one surface of the hollow pipe is pressed. The outer surface of the second trench 922 may slide while being in contact with the inner surface of the first trench 912.

The third part 930 may include a third head 933 and a third bar 931. The third head 933 may be smaller than the first head 913, and may face the first head 913 of the first part 910 with respect to the second part 920. The third head 933 may be rotatably connected or coupled to the upper bar 75 (see FIG. 17). The third bar 931 may have a hollow pipe shape. A third trench 932 may be formed while being recessed long from the third bar 931 in the up-down direction of the third bar 931. For example, the third trench 932 may be formed while one surface of the hollow pipe is pressed. The outer surface of the third trench 932 may slide while being in contact with the inner surface of the second trench 922.

Accordingly, the support bar 900 may extend and/or contract to form a stable structure while the first part 910, the second part 920, and the third part 930 do not rotate with each other.

Figure 24:
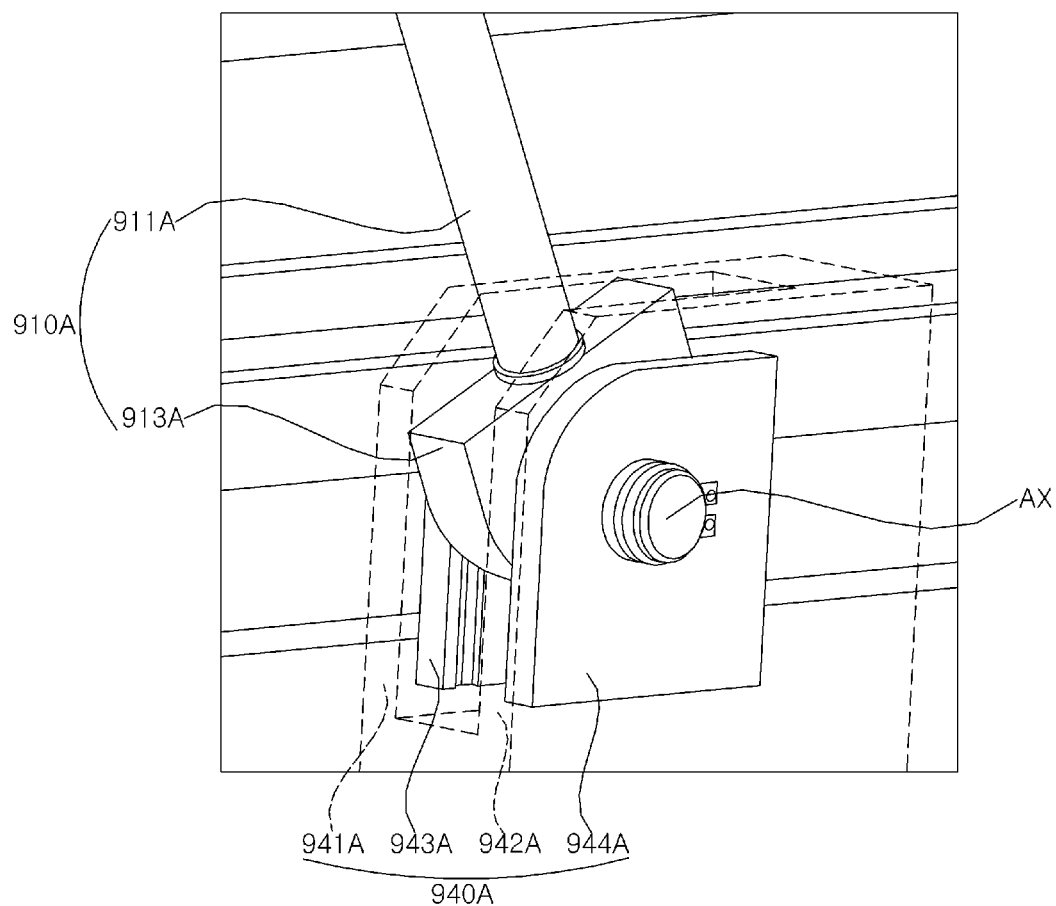

Referring to FIG. 24, a first head 913A of the first part 910A may be rotatably connected or coupled to the first stable mount 940A by a shaft AX. The first stable mount 940A may include a first mount plate 941A and a second mount plate 942A. The first mount plate 941A may face the second mount plate 942A. A first support plate 943A may be located or fixed to the inner side of the first mount plate 941A, and a second support plate 944A may be located or fixed to the inner side of the second mount plate 942A.

The first head 913A of the first part 910A may be located between the first support plate 943A and the second support plate 944A. The first head 913A may rub or contact the first support plate 943A and/or the second support plate 944A. The head 913A and the support plates 943A and 944A may be made of different materials. Accordingly, noise caused by friction between the head 913A and the support plates 943A and 944A can be prevented. For example, the head 913A may include a metal, and the support plates 943A and 944A may include a synthetic resin.

Accordingly, the support bar 900 is pivotably moved on the stable mount 940A, 940B to prevent the support bar 900 from being twisted, thereby preventing the opposite ends of the display panel 10 from shaking in the front-rear direction.

Figure 25:
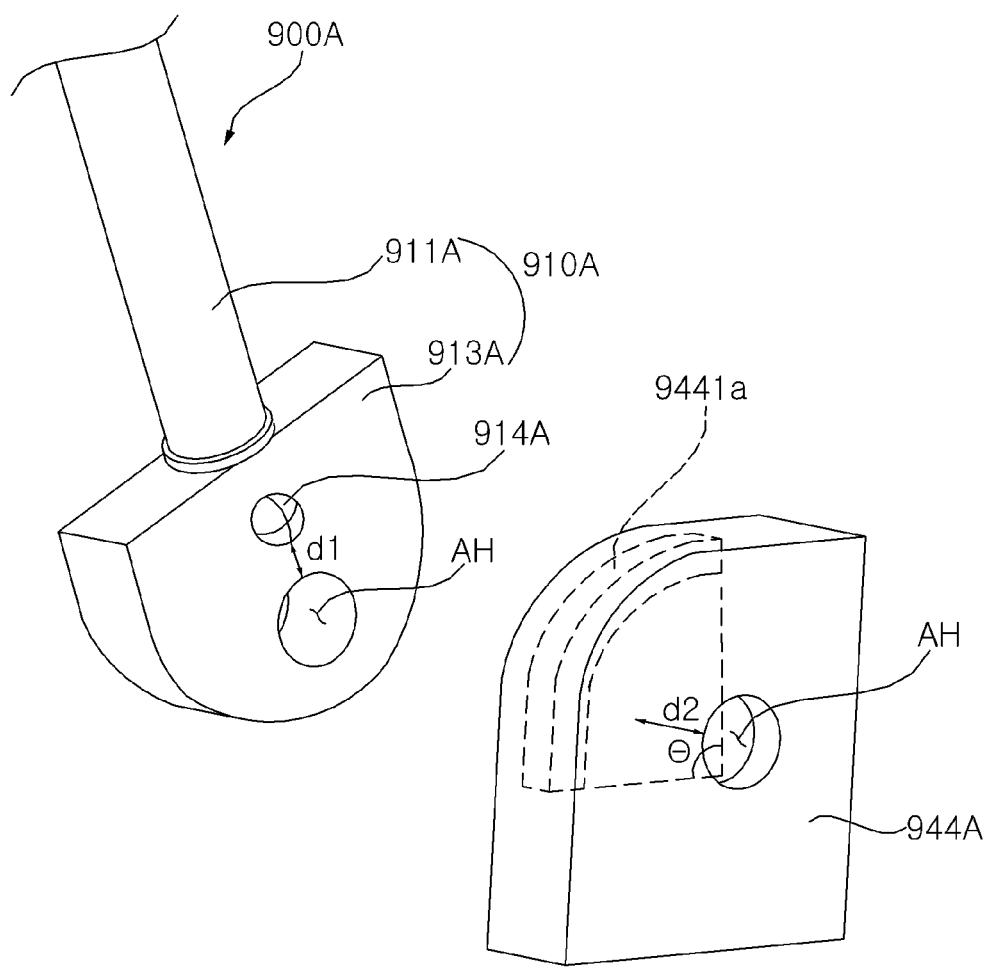

Referring to FIG. 25, a first guide protrusion 914A may be formed on the plane of the first head 913A. The first guide protrusion 914A may be spaced apart from a shaft hole AH of the first head 913A by a first distance d1. A first guide slot 9441a may be formed in the second support plate 944A. The first guide slot 9441a may have a fan shape as a whole. For example, the angle (theta) of an arc in which the first guide slot 9441a is formed may be within 60. The first guide slot 9441a may be spaced apart from the shaft hole AH of the second support plate 944A by a second distance d2. The second distance d2 may be the same as the first distance d1.

Accordingly, the support bar 900 is pivotably moved on the stable mount 940A, 940B to prevent the support bar 900 from being twisted, thereby strongly preventing opposite ends of the display panel 10 from shaking in the front-rear direction.

According to an aspect of the present disclosure, provided is a display device including: a housing that extends long and provides an internal accommodation space; a roller configured to be installed inside the housing; a display panel configured to be wound on or unwound from the roller; a module cover which extends long in a length direction of the housing, and includes a plurality of segments sequentially arranged in an up-down direction at a rearward direction of the display panel so as to be wound on or unwound from the roller together with the display panel; and a chain driving unit that is installed inside the housing, and unfolds the display panel and the module cover while a chain spreads from the inside of the housing to the outside.

According to another aspect of the present disclosure, the chain driving unit includes: a driving box including a first driving gear and a second driving gear that are located adjacent to each other; a first container that is located in one side of the driving box, and receives a first chain part; and, a second container that is located in the other side of the driving box, and receives a second chain part, wherein the first chain part is engaged with the first driving gear, the second chain part is engaged with the second driving gear, and the first chain part and the second chain part are coupled to each other while moving by the first driving gear and the second driving gear to form the chain, and spread to the outside of the chain driving unit, while a distal end of the chain spreading to the outside of the chain driving unit is fixed to the module cover.

According to another aspect of the present disclosure, the chain stands up by itself, after the first chain part and the second chain part are coupled.

According to another aspect of the present disclosure, the display device further includes: a stable mount mounted in the housing; and a support bar having one end pivotably connected to the stable mount and the other end pivotably connected to the module cover, wherein the support bar is stretched when the chain spreads to the outside of the housing, and contracts when the chain enters the inside of the housing.

According to another aspect of the present disclosure, the support bar includes a first support bar and a second support bar opposite to each other with respect to the chain, wherein the stable mount includes: a first stable mount located adjacent to the first container; and a second stable mount located adjacent to the second container, wherein a lower end of the first support bar is pivotally connected to the first stable mount, and an upper end thereof is pivotally connected to an upper side of the module cover, wherein a lower end of the second support bar is pivotally connected to the second stable mount, and an upper end thereof is pivotally connected to the upper side of the module cover, and wherein when the chain spreads to the outside of the housing, an angle formed by the first support bar and the second support bar decreases, and when the chain enters the inside of the housing, the angle formed by the first support bar and the second support bar increases.

According to another aspect of the present disclosure, the support bar includes: a first part pivotally connected to the stable mount; a third part pivotally connected to the module cover; and a second part connecting the first part and the third part, wherein when the support bar is contracted, the second part is received in the first part, and the third part is received in the second part, wherein the first part includes a first trench recessed along a length direction of the first part, wherein the second part includes a second trench recessed along a length direction of the second part, and wherein the third part includes a third trench recessed along a length direction of the third part, wherein an outer surface of the third trench is in contact with an inner surface of the second trench, and an outer surface of the second trench is in contact with an inner surface of the first trench.

According to another aspect of the present disclosure, the stable mount includes: a first mount plate and a second mount plate that face each other; a first support plate that is located between the first mount plate and the second mount plate, and fixed to an inner surface of the first mount plate; and a second support plate that is located between the first mount plate and the second mount plate, and fixed to an inner surface of the second mount plate, wherein the support bar includes a head that is inserted between the first support plate and the second support plate and rotates, wherein the head of the support bar and the first or second support plate are formed of different materials.

According to another aspect of the present disclosure, the head includes a guide protrusion protruding from an outer surface, wherein the first support plate or the second support plate includes a guide slot into which the guide protrusion is inserted and moved.

According to another aspect of the present disclosure, the guide slot has a fan shape, and an angle of an arc formed by the guide slot is an acute angle.

According to another aspect of the present disclosure, the support plate and the head share a single shaft on which the head rotates, wherein a distance to the guide slot from the shaft and a distance to the guide protrusion from the shaft are substantially the same.

Certain embodiments or other embodiments of the disclosure described above are not mutually exclusive or distinct from each other. Any or all elements of the embodiments of the disclosure described above may be combined or combined with each other in configuration or function.

For example, a configuration "A" described in one embodiment of the disclosure and the drawings and a configuration "B" described in another embodiment of the disclosure and the drawings may be combined with each other. Namely, although the combination between the configurations is not directly described, the combination is possible except in the case where it is described that the combination is impossible.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A display device comprising:
a housing that is elongated and provides an internal accommodation space;
a roller configured to be installed inside the housing;
a display panel configured to be wound on or unwound from the roller;
a module cover which extends along a length direction of the housing, and comprises a plurality of segments consecutively arranged in an up-down direction at a rear of the display panel so as to be wound on or unwound from the roller together with the display panel;
a chain driver that is installed inside the housing, and configured to unfold the display panel and the module cover while a chain spreads from an interior of the housing to outside the housing;
a stable mount mounted in the housing; and
a support bar having a first end pivotably coupled to the stable mount and a second end pivotably coupled to the module cover,
wherein the chain driver comprises:
a driving box comprising a first driving gear and a second driving gear that are located adjacent to each other;
a first container that is located at a first side of the driving box, and configured to receive a first chain portion; and
a second container that is located at a second side of the driving box, and configured to receive a second chain portion,
wherein the first chain portion is engaged with the first driving gear,
wherein the second chain portion is engaged with the second driving gear,
wherein the first chain portion and the second chain portion are coupled to each other while being moved by the first driving gear and the second driving gear to form the chain, and spread to outside the chain driver, while a distal end of the chain spreading to outside the chain driver is fixed to the module cover, and
wherein the support bar is stretched when the chain spreads to outside the housing, and contracts when the chain enters the interior of the housing.

2. The display device of claim 1, wherein the chain is configured to stand up by itself, after the first chain portion and the second chain portion are coupled.

3. The display device of claim 1, wherein the support bar comprises a first support bar and a second support bar that are opposite each other with respect to the chain,
wherein the stable mount comprises:
a first stable mount located adjacent to the first container; and
a second stable mount located adjacent to the second container,
wherein a lower end of the first support bar is pivotably coupled to the first stable mount, and an upper end of the first support bar is pivotably coupled to an upper side of the module cover,
wherein a lower end of the second support bar is pivotably coupled to the second stable mount, and an upper end of the second support bar is pivotably coupled to the upper side of the module cover, and
wherein when the chain spreads to outside the housing, a size of an angle formed by the first support bar and the second support bar decreases, and
wherein, when the chain enters the interior of the housing, the size of the angle formed by the first support bar and the second support bar increases.

4. The display device of claim 1, wherein the support bar comprises:
a first portion pivotably coupled to the stable mount;
a third portion pivotably coupled to the module cover; and
a second portion coupling the first portion and the third portion,
wherein when the support bar is contracted, the second portion is received in the first portion, and the third portion is received in the second portion,
wherein the first portion has a first trench recessed along a length direction of the first portion,
wherein the second portion has a second trench recessed along a length direction of the second portion,
wherein the third portion has a third trench recessed along a length direction of the third portion, and
wherein an outer surface of the third trench is in contact with an inner surface of the second trench, and an outer surface of the second trench is in contact with an inner surface of the first trench.

5. The display device of claim 1, wherein the stable mount comprises:
a first mount plate and a second mount plate that face each other;
a first support plate that is located between the first mount plate and the second mount plate, and fixed to an inner surface of the first mount plate; and
a second support plate that is located between the first mount plate and the second mount plate, and fixed to an inner surface of the second mount plate, wherein the support bar comprises a head that is inserted between the first support plate and the second support plate and configured to rotate,
wherein the head of the support bar and the first or the second support plate comprise different materials.

6. The display device of claim 5, wherein the head comprises a guide protrusion protruding from an outer surface of the head, and
wherein the first support plate or the second support plate has a guide slot into which the guide protrusion is configured to be inserted and moved.

7. The display device of claim 6, wherein the guide slot has a fan shape, and
wherein an angle of an arc formed by the guide slot is an acute angle.

8. The display device of claim 7, wherein the first support plate or the second support plate and the head share a shaft on which the head is configured to rotate,
wherein a distance to the guide slot from the shaft and a distance to the guide protrusion from the shaft are substantially equal to each other.

\* \* \* \* \*